United States Patent [19]

Kimura

[11] Patent Number: 5,032,786
[45] Date of Patent: Jul. 16, 1991

[54] METHOD OF A MEASURING PHYSICAL PROPERTIES OF BURIED CHANNEL

[75] Inventor: Mikihiro Kimura, Itami, Japan

[73] Assignee: Mitsubishi Denki Kabushiki Kaisha, Japan

[21] Appl. No.: 371,009

[22] Filed: Jun. 26, 1989

[30] Foreign Application Priority Data

Mar. 23, 1989 [JP] Japan ..................................... 1-69296

[51] Int. Cl.$^5$ ...................... G01R 19/08; G01R 31/28
[52] U.S. Cl. .............................. 324/158 T; 324/158 R; 324/158 SC; 437/8
[58] Field of Search ........... 324/158 R, 158 D, 158 T, 324/158 SC; 437/8

[56] References Cited

U.S. PATENT DOCUMENTS

| 3,605,015 | 9/1971 | Copeland, III | 324/158 D |
|---|---|---|---|
| 3,748,579 | 7/1973 | Henry et al. | 324/158 D |
| 3,995,216 | 11/1976 | Yun | 324/158 R |
| 4,323,842 | 4/1982 | McGarrity et al. | 324/158 R |
| 4,325,025 | 4/1982 | Corcoran et al. | 324/158 R |
| 4,382,229 | 5/1983 | Cottrell et al. | 324/158 T |
| 4,453,127 | 6/1984 | Schick | 324/158 T |
| 4,542,340 | 9/1985 | Chakravarti et al. | 324/158 R |
| 4,621,233 | 11/1986 | Davari et al. | 324/158 R |
| 4,675,801 | 6/1987 | Zoutendyk et al. | 324/158 R |
| 4,859,938 | 8/1989 | Kim et al. | 324/158 D |
| 4,906,921 | 3/1990 | Juge | 324/158 R |

OTHER PUBLICATIONS

U.S. S.I.R. Hill, Flesner, Aug. 1986.
"Measurements on Depletion-Mode Field Effect Transistors and Buried Channel MOS Capacitors for the Characterization of Bulk Transfer Charge-Coupled Devices", by Mohsen et al., Solid-St. Elec., vol. 18, pp. 407-416, Dec., 1975.
Grove et al., "Surface Effects on p-n Junctions: Characteristics of Surface Space-Charge Regions Under Non-Equilibrium Conditions", Dec. 1966, vol. 9, pp. 783-806.

Primary Examiner—Kenneth Wieder
Assistant Examiner—William J. Burns
Attorney, Agent, or Firm—Leydig, Voit & Mayer

[57] ABSTRACT

Disclosed is a method of measuring physical properties of a buried channel, e.g., a generation current in a semiconductor substrate in which the buried channel is formed, a generation current of the surface of the semiconductor substrate, a channel potential and a surface potential of the buried channel. A gate ramp voltage is applied to a gate electrode formed over the buried channel and a current generated from a depletion layer at the buried channel and a gate current produced by changes in the capacitance of the buried channel are measured. The physical properties of the buried channel are obtained from the measured currents.

2 Claims, 6 Drawing Sheets

METHOD OF A MEASURING PHYSICAL PROPERTIES OF BURIED CHANNEL

BACKGROUND OF THE INVENTION

1. Field of the Invention

This invention relates to a method of measuring physical properties of a buried channel formed under the surface of a semiconductor substrate, including the channel potential and the surface potential of the buried channel, a generation current in the semiconductor substrate and another generation current on the surface of the substrate.

2. Description of Related Art

FIG. 5 shows the structure of a buried-channel MOS transistor 10 wherein an n$^-$ layer buried channel 2 is formed at the surface of a p-type semiconductor substrate 1. N$^+$ contact portions 3 and 4 are formed at opposite ends of the buried channel 2. The upper surface of the buried channel 2 is covered with an insulation film 5. A gate electrode 6 is formed on the insulation film 5. This MOS transistor operates as a gate controlled diode with a source terminal 7 and a drain terminal, 8 respectively connected to the contact portions 3 and 4 that are connected as a common electrode to a reverse bias voltage $V_R$ FIGS. 6A and 6B show conventional measuring systems for measuring physical properties of the buried channel 2 with the semiconductor device 10 having this gate controlled diode structure.

The system shown in FIG. 6A measures a generation current inside the semiconductor substrate 1 together with a generation current at the surface thereof, and includes a small current measuring apparatus 11 and a CPU 12. The system shown in FIG. 6B measures the potential of the buried channel 2, the impurity density distribution therein and includes a low-frequency CV measuring apparatus 13, a power source 14 and a CPU 15. These systems are used as described below.

A reverse bias voltage $V_R$ is applied to the contact portions 3 and 4 of the semiconductor device 10 shown in FIG. 5. Changes in a reverse bias current $I_R$ are measured by the small current measuring apparatus 11 shown in FIG. 6A during the sweeping of a variable voltage gate voltage $V_G$ applied to the gate electrode 6. FIG. 7A shows results of this measurement. As described by A. S. Grove and D. J. Fitzgerald in Solid State Electronics, Volume 9, 1966, pp 783–806, a generation current Igen,$_{MJ}$ inside the semiconductor substrate 1 and a generation current Igen,s at the surface of the semiconductor substrate 1 can be obtained from the results shown in FIG. 7A.

The reverse bias voltage $V_R$ is applied from the power source 14 of the system shown in FIG. 6B to the contact portions 3 and 4 of the semiconductor device 10 shown in FIG. 5. A low-frequency gate voltage $V_G$ is applied from the low-frequency CV measuring apparatus 13 to the gate electrode 6, thereby measuring the low-frequency CV characteristics and obtaining results such as those shown in FIG. 7B. In FIG. 7B, $C_{OX}$ represents the capacitance of the insulation film 5. According to A. M. Mohsen and F. J. Morris: Solid State Electronics, Volume 18, 1975, pp 407–416, it is possible to calculate from the results shown in FIG. 7B a channel potential $\phi_{CH}$, a surface potential $\phi_s$, and a depth $X_{CH}$ from the surface to the position of the channel potential $\phi_{CH}$ with respect to the diagram of a potential distribution over the buried channel shown in FIG. 8. It is also possible to obtain an impurity density distribution between the surface and the channel position depth $X_{CH}$ by using low-frequency CV characteristics between a voltage $V_R + V_{FB}$ and a punch-through voltage $V_{PT}$ with respect to the depletion layer. $V_{FB}$ represents a flat-band voltage.

A method of calculating the channel potential $\phi_{CH}$ and the surface potential $\phi_s$ on the basis of the method of A. M. Mohsen and F. J. Morris will be described below with reference to the flow chart of FIG. 9. First, in step 91, results of measurement, such as those shown in FIG. 7B, obtained by the measuring system of FIG. 6B are displayed on a CRT (not shown) connected to the CPU 15. In step 92, the punch-through voltage $V_{PT}$ is input. In step 93, the channel potential $\phi_{CH}$ is calculated on the basis of an equation:

$$\phi_{CH} = V_R - V_{bi} \qquad [1]$$

where $V_{bi}$ represents a built-in potential of the buried channel 2 and the contact portions 3 and 4.

The surface potential $\phi_s$ is represented by an area $S_A$ of a hatched region A of FIG. 7B, and is calculated, in step 94, on the basis of an equation:

$$\phi_s = S_A = \int_{V_{INV}}^{V_{PT}} (1 - C/C_{ox}) dV_G \qquad [2]$$

where $V_{INV}$ represents the voltage on the inversion side.

The characteristics of the buried channel 2 are thus obtained. However, as described above, the conventional method requires two systems of different construction: one for measuring the generation current Igen,$_{MJ}$ in the semiconductor substrate 1 and the generation current Igen,s of the surface of the semiconductor substrate 1; and one for measuring the channel potential $\phi_{CH}$, the surface potential $\phi_s$, the depth $X_{CH}$ from the surface to the channel position and the impurity density distribution. These characteristic factors cannot be measured at one time and they are necessarily measured separately by using such systems. The construction of the overall system is therefore complicated, and the measuring operation is time-consuming and troublesome.

If the system of FIG. 6A and the system of FIG. 6B are combined to measure all the characteristic factors at one time, noise is superposed on the very small reverse bias current $I_R$ measured by the small current measuring apparatus 11 owing to oscillations of the low-frequency voltage used in the low-frequency CV measuring apparatus 13. As a result, the accuracy with which the generation current is measured reduced.

Since, at the time of full depletion, the depletion layers at the contact portions 3 and 4 contact the depletion layer at the buried channel 2 the influence of the capacitance at the periphery of the channel on the characteristic curve of the measured CV characteristic is usually considerable, as represented by hatched portion D in FIG. 10. An error proportional the area of the hatched portion D of FIG. 10, is caused in the calculation of the surface potential $\phi_s$ based on the equation [2] and using the CV characteristic curve measured by the low-frequency CV measuring apparatus 13. As a result the potential is not accurately measured.

SUMMARY OF THE INVENTION

In view of these problems, an object of the present invention is to provide a method of measuring physical properties of a buried channel with accuracy and ease.

To achieve the above object, in accordance with the present invention, there is provided a method of measuring physical properties of a buried channel which is formed under a surface of a first conduction type semiconductor substrate, on which a gate electrode is formed with an insulation film interposed between the gate electrode and the buried channel, and which is of a second conduction type different from the first conduction type, the method including: applying a gate ramp voltage to the gate electrode; measuring, during application of the gate ramp voltage, a current generated from a depletion layer at the buried channel and a gate current and changes in a capacitance of the buried channel; and obtaining the physical properties of the buried channel from the currents measured.

DESCRIPTION OF THE PREFERRED EMBODIMENT

An embodiment of the present invention will be described below with reference to the accompanying drawings.

Figure 1:
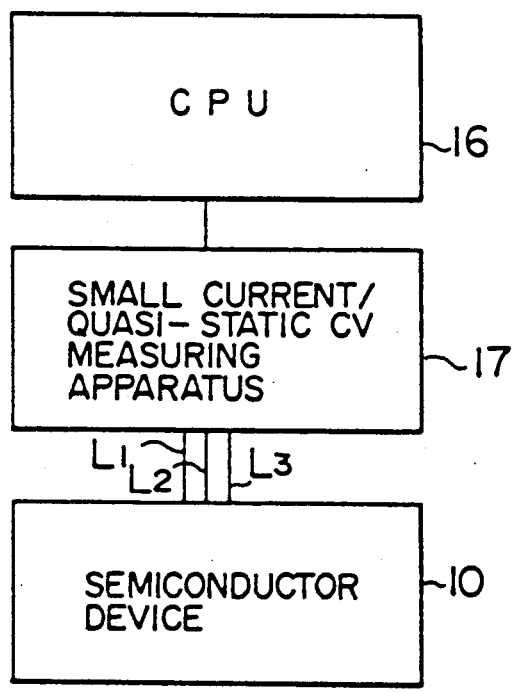
FIG. 1 is a block diagram of a measuring system for carrying out a method of measuring physical properties of a buried channel in accordance with the present invention.
Figure 5:
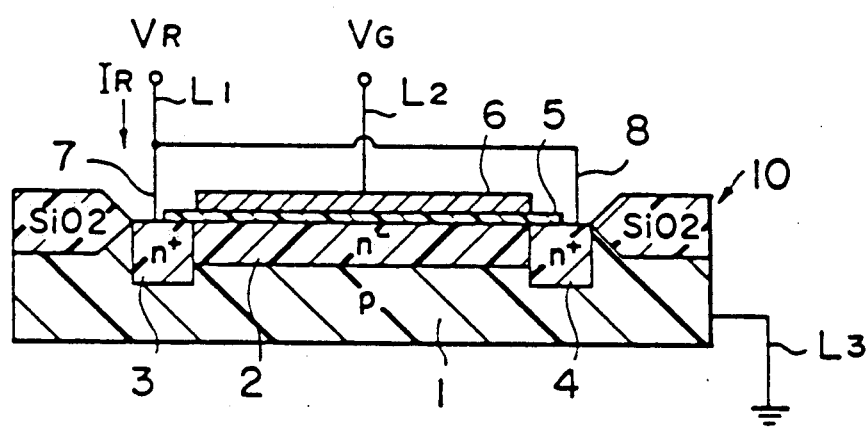
FIG. 5 is a cross-sectional view of a semiconductor device having a buried channel.
Figure 6A:
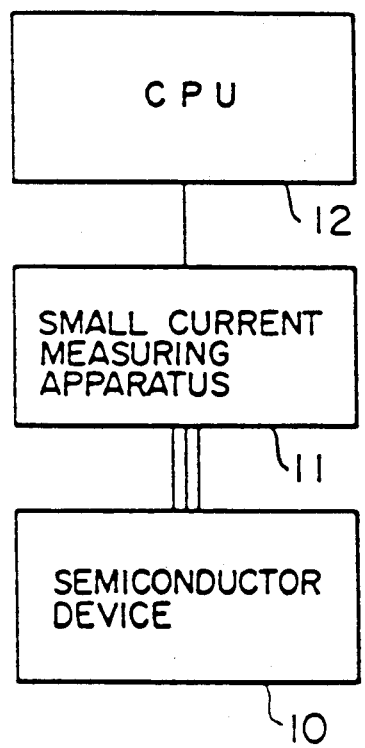
FIGS. 6A and 6B are block diagrams of conventional measuring systems.
Figure 6B:
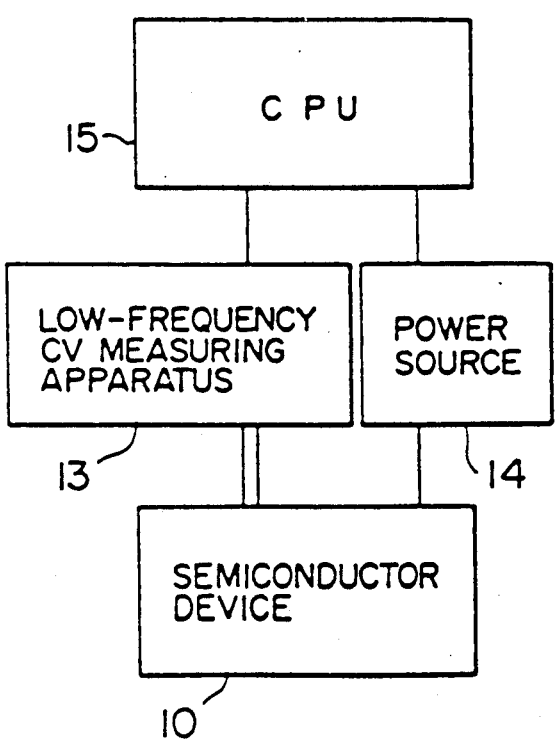

Referring to FIG. 1, a measuring system in accordance with the invention has a CPU 16 to which a small current/quasi-static CV measuring apparatus (hereinafter referred to simply as "measuring apparatus") 17 is connected. A small current/quasi-static CV measuring apparatus HP4140B, a product of Hewlett Packard Co. Ltd. may be used as the measuring apparatus 17. A semiconductor device 10 such as that shown in FIG. 5 is connected to the measuring apparatus 17. Three connection lines $L_1$, $L_2$, and $L_3$ which connect the measuring apparatus 17 and the semiconductor device 10 correspond to a reverse bias voltage $V_R$ supply line ne $L_1$, the gate voltage $V_G$ supply line $L_2$ and a grounding line $L_3$, respectively, shown in FIG. 5. A CRT (not shown) is connected to the CPU 16.

A method of measuring physical properties of the buried channel 2 of the semiconductor device 10 by using this measuring system will be described below. The measuring apparatus 17 first applies the predetermined reverse bias voltage $V_R$ to the contact portions 3 and 4 of the semiconductor device 10 via the supply line $L_1$ and applies the gate voltage $V_G$ to the gate electrode 6 via the supply line $L_2$. The gate ramp voltage $V_G$ is changed at a constant rate of change with time of $\Delta V_G/\Delta t$. At this time, a current generated from the depletion layer at the buried channel 2 flows as the reverse bias current $I_R$ to the source terminal 7 and to the drain terminal 8 and is measured by the measuring apparatus 17 through the supply line $L_1$. Simultaneously, the gate current $I_G$ flowing through the gate electrode 6 is measured by the measuring apparatus 17 through the supply line $L_2$.

Figure 2A:
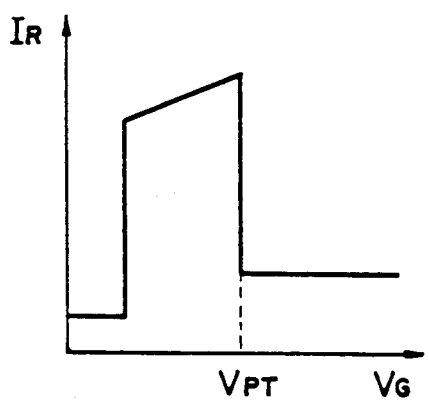
FIGS. 2A and 2B are diagrams of an $I_R - V_G$ characteristic and a quasi-static CV characteristic applying the voltage $V_R$, respectively, obtained according to the invention.
Figure 2B:
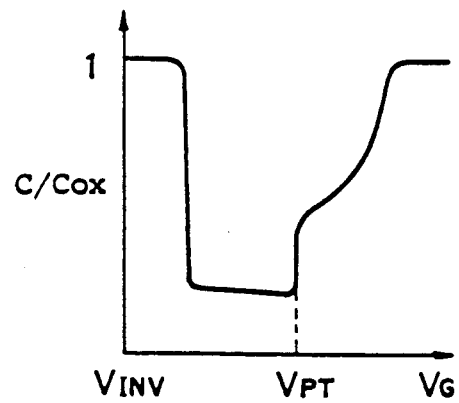

The CPU 16 obtains an $I_R - V_G$ characteristic such as that shown in FIG. 2A from the reverse bias current $I_R$ measured by the measuring apparatus 17, and displays this characteristic on the unillustrated CRT. The CPU 16 also calculates, from the gate current $I_G$ measured by the measuring apparatus 17, a quasi-static capacitance C of the buried channel 2 on the basis of the following equation:

$$C = I_G/(\Delta V_G/\Delta t) \qquad [3]$$

to obtain a quasi-static CV characteristic such as that shown in FIG. 2B, and displays the obtained characteristic on the CRT.

Figure 7A:
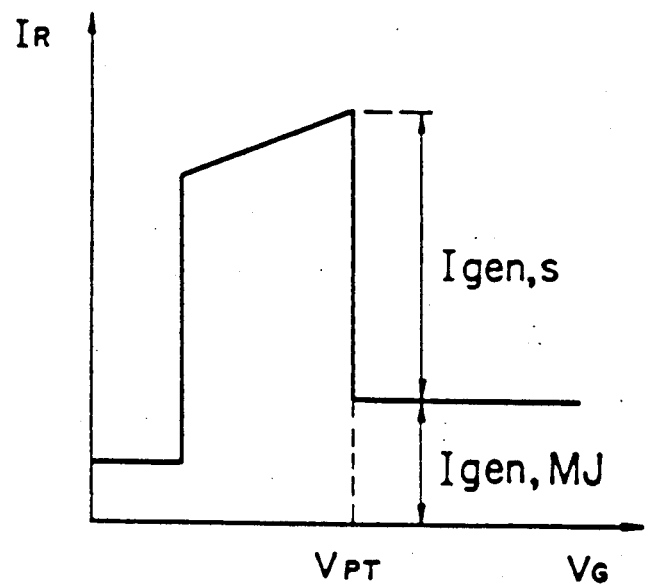
FIGS. 7A and 7B are diagrams of an $I_R - V_G$ characteristic and a low-frequency CV characteristic applying the voltage $V_R$, respectively, obtained by the systems shown in FIGS. 6A and 6B.
Figure 7B:
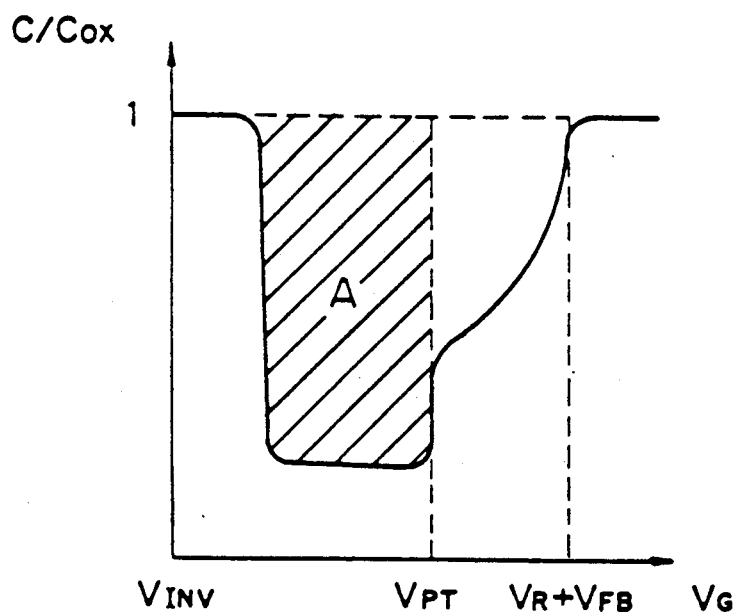
Figure 8:
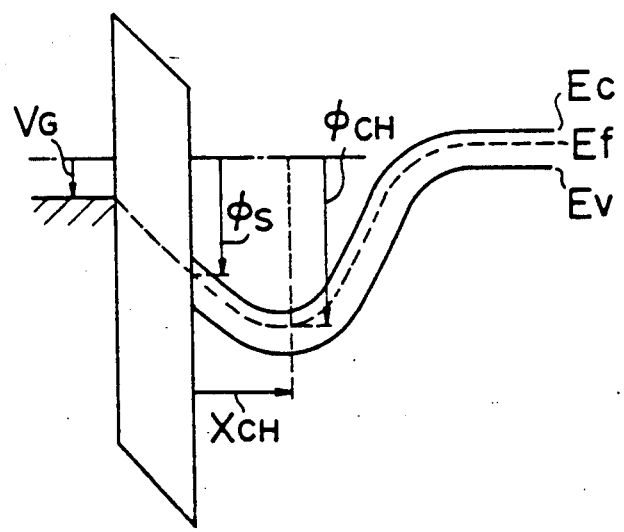
FIG. 8 is a diagram of a buried channel potential distribution.

Thereafter, the CPU 16 obtains the generation current $I_{gen,MJ}$ in the semiconductor substrate 1 and the generation current $I_{gen,s}$ at the surface of the semiconductor substrate 1 from the $I_R - V_G$ characteristic of FIG. 2A as in the case of the operation relating to FIG. 7A, and outputs obtained values. At the same time, the CPU 16 obtains the channel potential $\phi_{CH}$, the surface potential $\phi_s$, the depth $X_{CH}$ from the surface to the channel potential $\phi_{CH}$ and the impurity density distribution from the quasi-static CV characteristic of FIG. 2B, and outputs obtained values.

Figure 3:
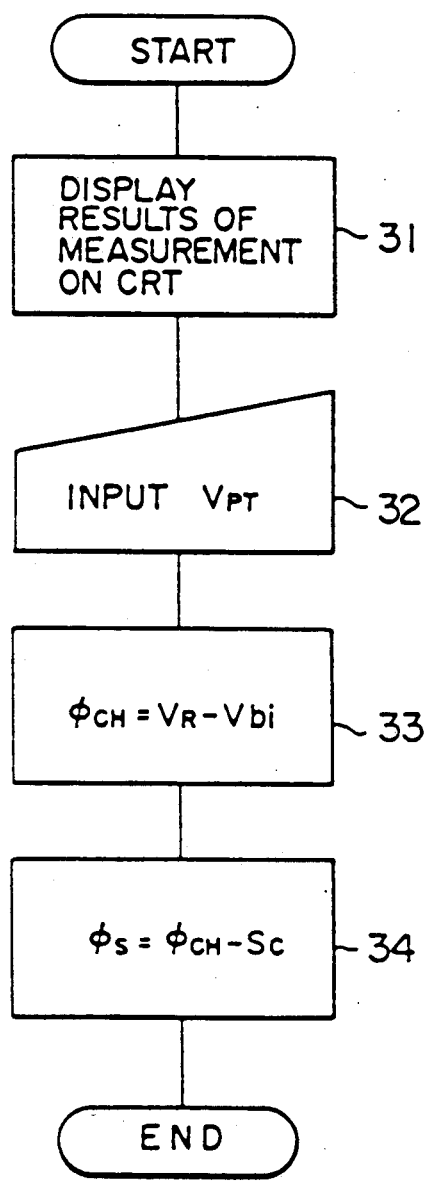
FIG. 3 is a flow chart of a calculation of channel potential $\phi_{CH}$ and surface potential $\phi_s$ in accordance with the invention.
Figure 9:
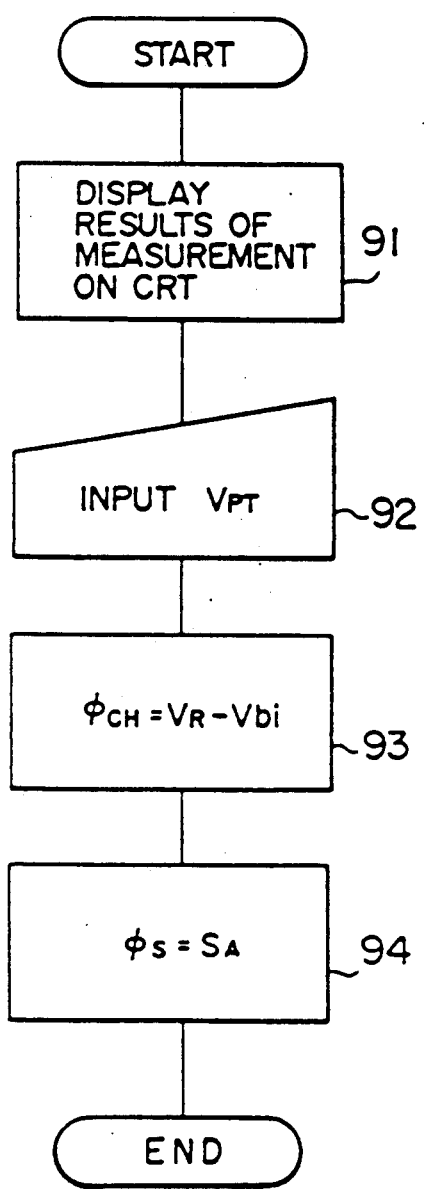
FIG. 9 is a flow chart of calculation of a channel potential $\phi_{CH}$ and surface potential $\phi_s$ based on the conventional method.

Calculation of the channel potential $\phi_{CH}$ and the surface potential $\phi_s$ performed in accordance with the invention will be described below with reference to the flow chart of FIG. 3. First, in step 31, the quasi-static CV characteristic of FIG. 2B is displayed on the CRT by the CPU 16. Then, in step 32, the punch-through voltage $V_{PT}$ is input to the CPU 16. In step 33, the channel potential $\phi_{CH}$ is calculated on the basis of the equation [1].

Figure 4A:
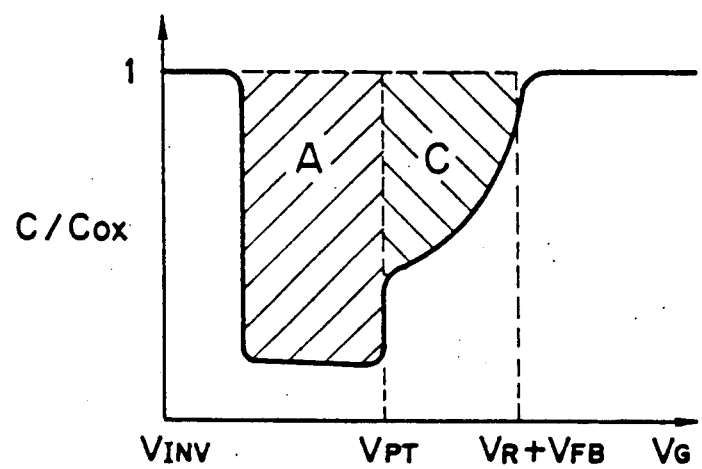
FIGS. 4A and 4B are diagrams of quasi-static CV characteristics, illustrating calculation of surface potential $\phi_s$ in accordance with the invention.
Figure 10:
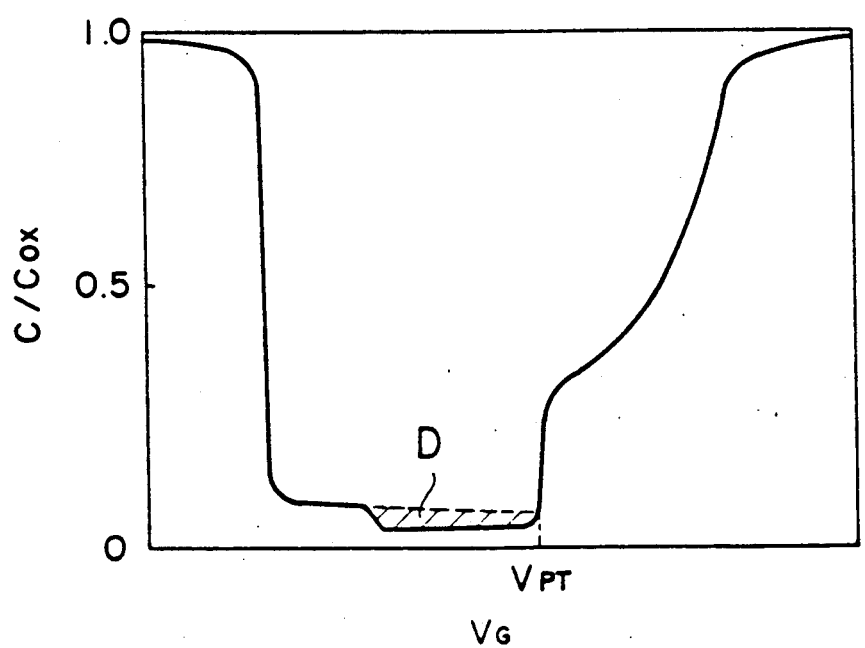
FIG. 10 is a diagram of a CV characteristic, illustrating a problem with respect to the conventional method.

Thereafter, the surface potential $\phi_s$ is obtained in step 34. The surface potential $\phi_s$ can be represented by the area $S_A$ of the hatched region A of FIG. 4A. Since, at the time of full depletion, the depletion layers at the contact portions 3 and 4 of the semiconductor device 10 contact the depletion layer at the buried channel 2, the influence of the capacitance at the periphery of the channel appears in the characteristic curve of the quasi-static CV characteristic, as in the case of the hatched portion D in FIG. 10. For this reason, it is not possible to obtain the surface potential $\phi_s$ accurately by calculating the area $S_A$ of the hatched region A of FIG. 4A by integration based on the equation [2].

Figure 4B:
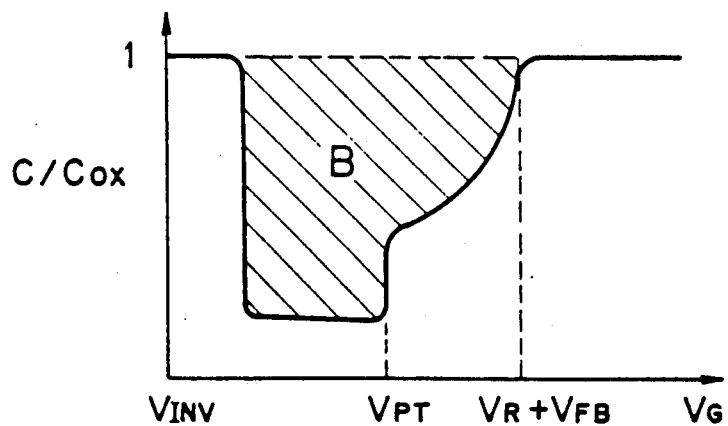

In this embodiment, the surface potential $\phi_s$ is calculated as described below. The channel potential $\phi_{CH}$ can be represented by the area $S_B$ of a hatched region B of FIG. 4B, and an error at the time of full depletion is included in the calculation of the area $S_B$. However, the value of the channel potential $\phi_{CH}$ obtained by the equation [1] is accurate since no capacitance value measured in the full depletion state is used. It is therefore possible to calculate the surface potential $\phi_s$ accurately by subtracting the area $S_C$ of a hatched portion C of FIG. 4A from the channel potential $\phi_{CH}$ obtained by the equation [1] without using any capacitance value measured in the full depletion state. That is, the calculation is performed by using the following equation:

$$\phi_s = \phi_{CH} - S_C = (V_R - V_{bi}) - \int_{V_{PT}}^{V_R + V_{FB}} (1 - C/C_{ox}) dV_G \quad [4]$$

As described above, quasi-static CV characteristic measurement is performed and the surface potential $\phi_s$ is calculated by the equation [4], thus enabling the physical properties of the buried channel to be measured accurately after sweeping the gate voltage $V_G$ only one time.

What is claimed is:

1. A method of measuring physical properties of a buried channel layer of a second conductivity type disposed at a surface of a first conductivity type semiconductor substrate, an insulating film being disposed on the buried channel opposite the substrate, a gate electrode being disposed on said insulating film, comprising:

while applying a reverse bias voltage across the buried channel and substrate, applying a gate ramp voltage to the gate electrode;

simultaneously measuring, during application of the reverse bias and gate ramp voltages, a substrate current flowing between the substrate and the buried channel and a gate current flowing into the gate electrode; and calculating physical properties, such as channel potential, surface potential, and dopant impurity density distribution, of the buried channel from the measured substrate and gate currents.

2. A method according to claim 1 wherein the buried channel includes second conductivity type contacts to which the reverse bias voltage is connected including calculating the surface potential $\phi_s$ of the buried channel from:

$$\Phi_S = (V_R - V_{bi}) - \int_{V_{PT}}^{V_R + V_{FB}} (1 - C/C_{ox}) dV_G$$

where $V_R$ is the reverse bias voltage applied across the buried channel and substrate; $V_{bi}$ is a built-in potential between the buried channel and the contacts; $V_{FB}$ is a flat-band voltage of the buried channel; $V_{PT}$ is a punch-through voltage of the buried channel; C is a capacitance of the buried channel; $C_{OX}$ is a capacitance of the insulating film; and $V_G$ is the gate ramp voltage.

* * * * *